US012700448B2

(12) United States Patent (10) Patent No.: US 12,700,448 B2

McCrate et al. (45) Date of Patent: Aug. 4, 2026

(54) MEMORY DEVICE ARCHITECTURE USING MULTIPLE PHYSICAL CELLS PER BIT TO IMPROVE READ MARGIN AND TO ALLEVIATE THE NEED FOR MANAGING DEMARCATION READ VOLTAGES

(71) Applicant: Micron Technology, Inc., Boise, ID (US)

(72) Inventors: Joseph Michael McCrate, Boise, ID (US); Robert John Gleixner, San Jose, CA (US); Hari Giduturi, Folsom, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/749,412

(22) Filed: Jun. 20, 2024

(65) Prior Publication Data

US 2024/0339149 A1 Oct. 10, 2024

Related U.S. Application Data

(63) Continuation of application No. 18/182,305, filed on Mar. 10, 2023, now Pat. No. 12,020,743, which is a (Continued)

(51) Int. Cl.
  G11C 13/00 (2006.01)
  G11C 11/408 (2006.01)
  G11C 11/4091 (2006.01)

(52) U.S. Cl.
  CPC ...... G11C 11/4087 (2013.01); G11C 11/4091 (2013.01); G11C 13/0002 (2013.01); G11C 13/0023 (2013.01); G11C 13/0026 (2013.01);

G11C 13/003 (2013.01); G11C 13/004 (2013.01); G11C 13/0069 (2013.01); (Continued)

(58) Field of Classification Search
  CPC .............. G11C 13/004; G11C 13/0002; G11C 13/0026; G11C 13/0069
  See application file for complete search history.

(56) References Cited

U.S. PATENT DOCUMENTS 7,859,885 B2 * 12/2010 Toda .................. G11C 13/0007
  365/158
9,117,519 B2 8/2015 Spessot et al.
  (Continued)

OTHER PUBLICATIONS

Chen, et al. "HfOx Based Vertical Resistive Random Access Memory for Cost-Effective 3D Cross-Point Architecture without Cell Selector," IEEE International Electron Devices Meeting (IEDM), Dec. 10-13, 2021.

(Continued)

*Primary Examiner* — Mushfique Siddique

(74) *Attorney, Agent, or Firm* — Greenberg Traurig

(57) ABSTRACT

The application relates to an architecture that allows for less precision of demarcation read voltages by combining two physical memory cells into a single logical bit. Reciprocal binary values may be written into the two memory cells that make up a memory pair. When activated using bias circuitry and address decoders the memory cell pair creates current paths having currents that may be compared to detect a differential signal. The application is also directed to writing and reading memory cell pairs.

19 Claims, 6 Drawing Sheets

Related U.S. Application Data continuation of application No. 17/080,310, filed on Oct. 26, 2020, now Pat. No. 11,605,418.

(52) U.S. Cl.
CPC ................ *G11C 2013/0045* (2013.01); *G11C 2211/4013* (2013.01)

(56) References Cited

U.S. PATENT DOCUMENTS

| | | | |
|---|---|---|---|
| 9,613,695 | B2 | 4/2017 | Spessot et al. |
| 10,157,669 | B2 | 12/2018 | Johnson |
| 10,366,747 | B2 | 7/2019 | Castro |
| 10,381,075 | B2 * | 8/2019 | Totorelli ................ H10B 63/80 |
| 10,395,738 | B2 | 8/2019 | Castro |
| 10,546,632 | B2 | 1/2020 | Redaelli et al. |
| 10,777,272 | B2 | 9/2020 | Aoki |
| 11,133,062 | B1 | 9/2021 | Pellizzer |
| 11,605,418 | B2 | 3/2023 | Mccrate et al. |
| 12,020,743 | B2 | 6/2024 | Mccrate et al. |
| 2004/0257871 | A1 | 12/2004 | Swift |
| 2006/0136659 | A1 | 6/2006 | Jain et al. |
| 2006/0203541 | A1 | 9/2006 | Toda |
| 2007/0140029 | A1 | 6/2007 | Kim et al. |
| 2010/0195362 | A1 * | 8/2010 | Norman ............... G11C 7/1075 365/189.16 |
| 2012/0163108 | A1 * | 6/2012 | Kazuno ................. G11C 29/36 365/201 |
| 2013/0286729 | A1 | 10/2013 | Chih |
| 2015/0279439 | A1 * | 10/2015 | Pyo ........................ G11C 7/062 365/158 |
| 2016/0125939 | A1 | 5/2016 | Park et al. |
| 2016/0189769 | A1 | 6/2016 | Jeloka et al. |
| 2016/0284399 | A1 | 9/2016 | Mantegazza et al. |
| 2019/0189203 | A1 * | 6/2019 | Redaelli ................ H10N 70/24 |
| 2019/0252019 | A1 | 8/2019 | Aoki |
| 2019/0295610 | A1 * | 9/2019 | Fantini ............... G11C 13/0033 |
| 2021/0142847 | A1 | 5/2021 | Kim et al. |
| 2021/0192325 | A1 | 6/2021 | Hoang et al. |
| 2021/0303265 | A1 | 9/2021 | Yudanov |
| 2022/0130447 | A1 | 4/2022 | Mccrate et al. |
| 2023/0215489 | A1 | 7/2023 | Mccrate et al. |

OTHER PUBLICATIONS

Title: Memory Device Architecture using Multiple Physical Cells per Bit to Improve Read Margin and to Alleviate the Need for Managing Demarcation Read Voltages, U.S. Appl. No. 17/080,310, filed Oct. 26, 2020 Confirmation: 3180 Status Date: Feb. 22, 2023 Inventors: Joseph McCrate, et al. Status: Patented Case.

Title: Memory Device Architecture using Multiple Physical Cells per Bit to Improve Read Margin and to Alleviate the Need for Managing Demarcation Read Voltages, U.S. Appl. No. 18/182,305, filed Mar. 10, 2023 Confirmation: 6798 Status Date: Jun. 5, 2024 Inventors: Joseph McCrate, et al. Status: Patented Case.

* cited by examiner

MEMORY DEVICE ARCHITECTURE USING MULTIPLE PHYSICAL CELLS PER BIT TO IMPROVE READ MARGIN AND TO ALLEVIATE THE NEED FOR MANAGING DEMARCATION READ VOLTAGES

RELATED APPLICATIONS

The present application is a continuation application of U.S. patent application Ser. No. 18/182,305, filed Mar. 10, 2023, issued as U.S. Pat. No. 12,020,743 on Jun. 25, 2024, which is a continuation application of U.S. patent application Ser. No. 17/080,310, filed Oct. 26, 2020, issued as U.S. Pat. No. 11,605,418 on Mar. 14, 2023, the entire disclosure of which application is hereby incorporated herein by reference.

FIELD OF THE TECHNOLOGY

At least some embodiments disclosed herein relate generally to selecting memory cells of a memory device as part of a read or write operation.

BACKGROUND

A memory device is made up of memory cells that may be individually selected for purposes of performing operations such as, for example, reading and writing. A memory cell may store a piece of data such as, for example, a binary digit. Memory cells may be arranged in grid-like manner where they are selected by activating the row and the column of the memory cell. To select a memory cell, a conductive line corresponding to the row and a conductive line corresponding to the column may need to receive specific demarcation read voltages (VDMs). For example, data is encoded in a memory cell by modifying the cell properties to achieve a particular threshold voltage (Vt) of the cell. A cell is considered to turn on if the VDM is greater than the Vt of the cell. When VDM>Vt, the cell may conduct current. When VDM<Vt, the cell does not conduct current.

The circuitry used to generate VDMs may include complicated analog circuits such as current mirrors, reference voltage generators, and other biasing circuits that generate specific VDMs. Moreover, as a memory device is used over time, or as ambient temperature changes, different VDM levels may need to be generated. For example, a memory cell may experience Vt drift over time. As a result, a particular VDM level that may accurately measure the cell at the beginning of the cell's life (e.g., time zero), may not accurately measure the cell months or years later.

To provide more context, during a read operation, one or more memory cells are "sensed" to ascertain a bit value encoded in the memory cell. Memory cells are sensed by applying a VDM to a target memory cell in an attempt to induce a current across the memory cell. The strength of the current corresponds to the bit value. For example, a strong current signal may represent a binary "1" while a weak current signal (e.g., no current or negligible current) may represent a binary "0." Memory cells may be arranged in a grid-like manner such that memory cells are addressable by a row and a column. To access a target memory cell, VDMs are generated and applied to the cell's row and column. Once the cell is selective (e.g., activated), it may produce a current that is detected along the cell's column, where the current corresponds to the cell's state (and represents the stored value in the cell). Generating a precise VDM poses many challenges. For example, cells may degrade over time, thereby changing the requirements for a specific VDM strength. In addition, memory devices may vary from one device to another thereby required VDM to be tuned to a specific device. Further, within the same device, different memory arrays or different portions in the memory array may have varying resistive paths such that the VDM needed for one cell in the memory device may be different from the VDM in a different cell.

DETAILED DESCRIPTION

Figure 1:
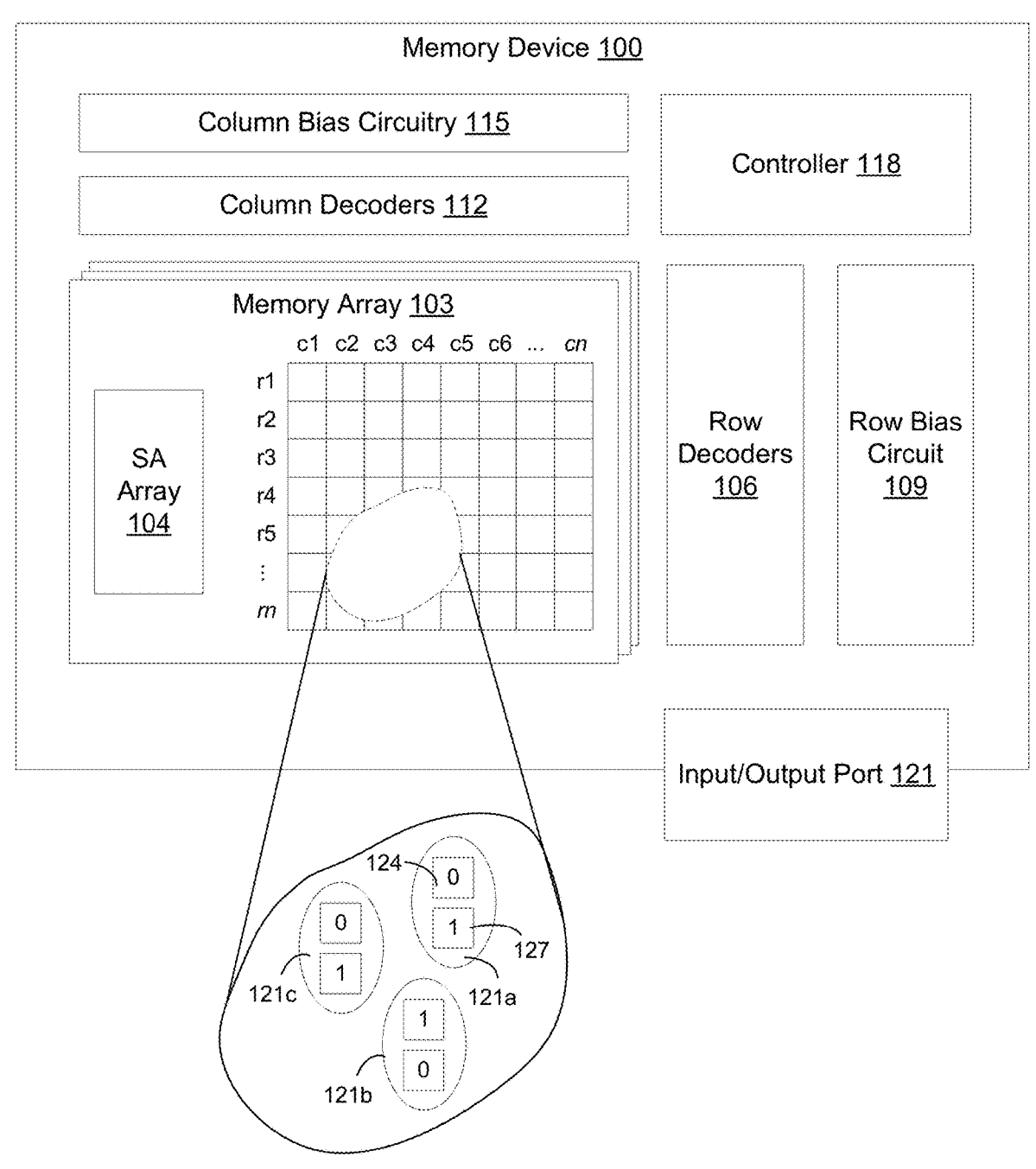
FIG. 1 is a drawing of a memory device according to embodiments of the present disclosure.

The present disclosure is directed to systems and methods of memory device architecture that alleviates the need for managing and controlling demarcation read voltages (VDMs) when performing read operations on a memory device. Specifically, the present disclosure is directed to logically combining physical memory cells into a logical single bit. This approach reduces the need for precise VDMs.

To provide more context, during a read operation, one or more memory cells are "sensed" to ascertain a bit value encoded in the memory cell. Memory cells are sensed by applying a VDM to a target memory cell in an attempt to induce a current across the memory cell. The strength of the current corresponds to the bit value. For example, a strong current signal may represent a binary "1" while a weak current signal (e.g., no current or negligible current) may represent a binary "0." Memory cells may be arranged in a grid-like manner such that memory cells are addressable by a row and a column. To access a target memory cell, VDMs are generated and applied to the cell's row and column. Once the cell is selective (e.g., activated), it may produce a current that is detected along the cell's column, where the current corresponds to the cell's state (and represents the stored value in the cell). Generating a precise VDM poses many challenges. For example, cells may degrade over time, thereby changing the requirements for a specific VDM strength. In addition, memory devices may vary from one device to another thereby required VDM to be tuned to a specific device. Further, within the same device, different memory arrays or different portions in the memory array may have varying resistive paths such that the VDM needed for one cell in the memory device may be different from the VDM in a different cell.

The present disclosure maps a logical signal bit to two physical cells, referred to as a memory cell pair (cell 0 and cell 1). Cell 0 and cell 1 of a memory cell pair store reciprocal values. For example, a logical binary "1" is stored such that cell 0 stores a binary "1" and cell 1 stores a binary "0." And a logical binary "0" is stored such that cell 0 stores a binary "0" and cell 1 stores a binary "1." While this architecture ultimately reduces a memory device's storage capacity in about half, several benefits may be realized.

For example, various embodiments allow for a memory device to function reliably with a smaller intrinsic window. In addition, there may be no margin loss due to threshold voltage drift and no margin loss due to systematics (e.g., when using electrically matched cells). Further, there may be no need to track which VDM to use through time or endurance over the lifespan of the memory device. Additional benefits include simplifying system level media management by allowing for less precise VDMs, Relaxing requirements to ensure uniform threshold voltages across a memory array, reducing the need for a Read Retry operation, and providing a more deterministic read latency to end users.

FIG. 1 is a drawing of a memory device according to embodiments of the present disclosure. The memory device 100 is an integrated circuit. The memory device 100 may be a semiconductor chip or die or a die stack. The memory device 100 may include one or more memory arrays 103. A memory array 103 comprises a plurality of rows and columns and may be defined in terms of a row-column size. The example of FIG. 1 shows a memory array 103 having rows labeled r1-rn and columns c1-cn. At each row and column, intersection is a memory cell configured to store a value. For example, a data array may contain four elements as follows: [A, B, C, D] where the first element is A, the second element is B, the third element is C, and the fourth element is D. The data array [A, B, C, D] may be stored in the memory array 103 such that each element of the data array is stored in a corresponding memory cell. For example, element A may be stored in cell (r1, c1), element B may be stored in cell (r1, c2), element C may be stored in cell (r1, c3), and element D may be stored in cell (r1, c4). Thus, in this example, the data array [A, B, C, D] is stored along the first row and occupies the first four columns. This is referred to as a "bit-parallel" configuration. As another example, the data array [A, B, C, D] may be stored along the first column occupying the first four rows. Here, element A may be stored in cell (r1, c1), element B may be stored in cell (r2, c1), element C may be stored in cell (r3, c1), and element D may be stored in cell (r4, c1). This is referred to as a "bit-serial" configuration. Each element [A, B, C, D] may be a binary digit (e.g., a zero or a 1, or a high value and a low value). Thus, the memory array 103 is a hardware component used to store data as a plurality of array elements addressable by rows and columns. A row may also be referred to as a word line and a column may be referred to as a bit line. The word line may be coupled to the gate of the memory cell while the bit line may couple to the source of the memory cell.

According to embodiments, the memory device 100 may be a Resistive Random Access Memory (ReRAM), 3D Cross Point (3DXP), or other memory devices that implement resistive memory cells or other memory cells that can offer to flex or modulate their conductance. Such cells can be diodes, transistors including floating gain and replacement gate transistors, etc. For example, resistive memory cells store data by modulating the resistance of the memory cell according to the data it stores. If a resistive memory cell stores a binary "0", the resistance may be set to a low value so that the memory cell forms a short circuit (e.g., a resistive short). If the memory cell stores a binary "1", the resistance may be set to a high value so that the memory cell forms an open circuit (e.g., a resistive open). Other asymmetric elements that may serve as memory cells include, for example, transistors and magnetic tunnel junctions (MTJs). Memory cells may be include self-selecting memory cells such as, for example, chalcogenide-based memory cells that may be set/reset in low/high threshold voltage to program "1"/"0" logical values. Thus, a single memory cell may store a bit value by having the physical properties (e.g., resistance) modified to encode the bit value. The modification of the memory cell to encode a bit is referred to as a "write" operation. After a memory cell is written to a specific bit value (e.g., binary "1" or binary "0"), a read operation may be performed to detect the bit value. In some embodiments the programming of a memory cell may involve forward or reverse biasing the memory cell.

When the memory device 100 is embodied as a 3D Cross Point device, the memory cells may be organized in different decks. A deck is a layer of memory cells, where decks are stacked on top of one another to increase memory density. A memory array 103 may be made up of multiple decks of memory cells. In this respect, a memory cell may be located according to memory array 103, a deck within the memory array 103, a row of the deck, and a column of the deck.

The memory array 103 may include a sense amplifier (SA or sense amp) array 104 made up of sense amps. A sense amp may be coupled to the columns (e.g., bit lines) of the memory cells to detect a current or voltage that flows through the memory cell as part of a read operation.

The memory device 100 may include decoder circuitry to identify and select specific memory cells. The decoder circuitry may include row decoders 106 to activate (e.g., charge or enable) a row of memory cells being addressed. For example, an address may be provided to the row decoders 106 and the row decoder identifies the physical cells mapped to the input address. The row decoders 106 may couple to a row bias circuit 109. The row bias circuit 109 provides the necessary bias voltages to the selected rows depending on different modes of cell operation (e.g., read, write). The row bias circuit 109 may include a voltage generator, voltage regulator, current mirror, or other active components that generate a specific target voltage or current. The row bias circuit 109 may be coupled to the row decoder circuitry 106 to provide the appropriate bias voltage or bias current to activate memory cells on specific rows (e.g., word lines).

The decoder circuitry may include column decoders 112 to select and activate (e.g., charge or enable) a column of memory cells being addressed. For example, an address may be provided to the column decoders 112 and the column decoder identifies the physical cells mapped to the input address. The column decoders 112 may couple to a column bias circuitry 115. The column bias circuitry 115 provides the necessary bias voltages to the selected columns depending on different modes of cell operation (e.g., read, write). The column bias circuitry 115 may include a voltage generator, voltage regulator, current mirror, or other active components that generate a specific target voltage or current. The column bias circuitry 115 may be coupled to the column decoder circuitry 112 to provide the appropriate bias voltage or bias current to activate memory cells on specific columns (e.g., bit lines).

The row decoders 106 and column decoders 112 work together to select specific memory cells that are being addressed as part of a read or write operation. The activation of a memory cell may induce a current or voltage signal that is sensed as part of a read operation where the current signal corresponds to the memory cell bit value. The sense amp array 104 may be used to read the current through activated memory cells.

The memory device 100 may further include a controller 118. The controller 118 includes the logic implemented by the memory device. The controller 118 may be a special-purpose processor or other component that implements logic that is executed by the memory device. The controller 118 may comprise integrated circuitry dedicated to store data in the memory array 103.

In some embodiments, the controller 118 may be implemented as a separate device that couples to the memory device 100. For example, the controller 118 may be implemented in an Application-Specific Integrated Circuit (ASIC), Field Programmable Gate Array (FPGA), or other special purpose processor. The controller may thus be part of a host device that couples to the memory device 100.

The controller 118 may include microcode that initiates operations such as, for example, read operations and write operations. The controller 118 may interpret the output of the sense amp array 104 to determine the bit value of activated memory cells as part of a read operation. The controller 118 may control the row decoders 106, row bias circuit 109, column decoders 112, and column bias circuitry 115 by providing control signals to various components of the memory device 100.

The memory device 100 may also include an input/output (I/O) port 121. The I/O port 121 may provide data and/or control signals between the memory device 100 and external systems. The I/O port 121 may couple to an internal bus that connects various components of the memory device 100. The internal bus may internally link various components of memory device 100 that allow these components to exchange data and/or control signals among each other. The I/O port 121 may be coupled to, for example, a DDR5 bus or PCIe bus. In this respect, an external system may read or write data to the memory array 103. In addition, external systems may transmit control signals to the controller 118 to program or otherwise control the controller 118.

An external system may include a host processor with a PCB motherboard, wherein the memory device 100 is connected to host processor over a bus such as DDR4, DDR5 or PCIe or the like. The external system may execute an operating system, applications, libraries, scripts, or programming languages. The external system may include one or more server racks or computers or other arrangements. A server may be a single installation or may be distributed among many different geographical locations.

The present disclosure is directed to storing a single bit of data using a memory cell pair. The example of FIG. 1 shows an exploded view that visualizes various memory cell pairs 121a-c. Specifically, the memory device 100 includes a plurality of memory cells arranged in a plurality of memory cell pairs, wherein a memory cell pair is configured to store a single bit. FIG. 1 depicts a first memory cell pairs 121a, a second memory cell pair 121b, and a third memory cell pair 121c. Each memory cell pair 121a-c is made up of a first memory cell 124 and a second memory cell 127. In some embodiments, the first memory cell 124 and a second memory cell 127 are adjacent with respect to one another. In some embodiments, the first memory cell 124 and a second memory cell 127 are located at adjacent columns while being located at the same row. In some embodiments, the first memory cell 124 and a second memory cell 127 are located at adjacent rows while being located at the same column. The architecture, according to embodiments, may pair memory cells that have similar or equivalent resistive paths. The resistive path of a memory cell may be defined by its physical location within the memory device. The resistive path may be a function of the length of conductive wiring or number of vias that is traversed to between the memory cell and the bias circuitry or sense amplifier.

The first memory cell 124 and a second memory cell 127 represent two physical memory cells that map to a single logical memory cell such that the two physical memory cells may each store separate bits while the single logical memory cell corresponds to a single bit. When the first memory cell 124 is programmed as a binary "1" (e.g., set state), the second memory cell 127 in the memory cell pair is programmed to the inverse or reciprocal value, which is a binary "0" (e.g., reset state). When the first memory cell 124 is program as a binary "0" (e.g., reset state), the second memory cell 127 in the memory cell pair is programmed to the inverse or reciprocal value, which is a binary "1" (e.g., set state). In other words, a logic bit "0" can be represented by combination "01" in the two memory cells 124, 127. Similarly, a logic bit "1" can be represented by the combination "10" in the two memory cells 124, 127.

Thus, the two cells in a particular memory cell pair 121a-c stores reciprocal values. In some embodiments, both the first memory cell 124 and the second memory cell 127 of a given memory cell pair 121a-c are not to be programmed to the same value. When reading the binary value of a particular memory cell pair 121a-c, the differential current between the first memory cell 124 and the second memory cell 127 to determine whether the memory cell pair 121a-c has stored a binary "1" or binary "0."

Figure 2A:
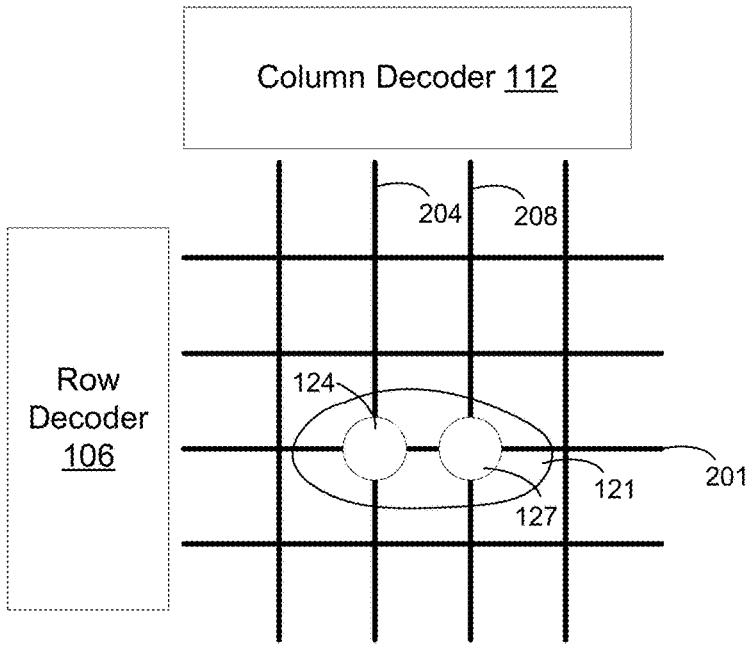
FIGS. 2A and 2B are drawings of different architectures of the memory device according to embodiments of the present disclosure.
Figure 2B:
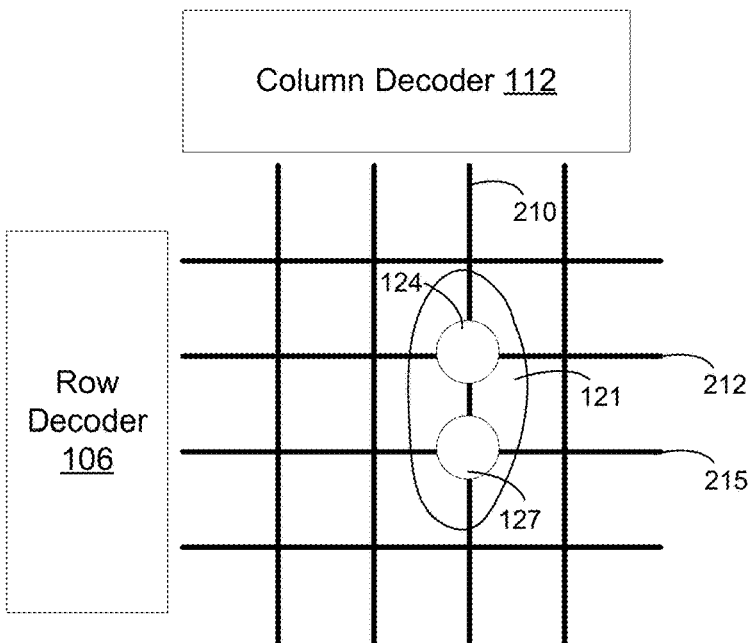

FIGS. 2A and 2B are drawings of different architectures of the memory device according to embodiments of the present disclosure. FIG. 2A shows a memory cell pair 121 made up of a first memory cell 124 and a second memory cell 127 that are paired together. From an end user perspective, the memory cell pair 121 appears as a single logical cell, however, it is made up of two separate physical memory cells. In FIG. 2A, the first memory cell 124 and a second memory cell 127 share the same row (e.g., word line) 201 but are located on different columns (e.g., bit lines) 204, 208. The first column 204 couples to the first memory cell 124 while a second column 208 couples to the second memory cell 127. In some embodiments the first column 204 and second column 208 are adjacent. In other embodiments, they are not adjacent.

The row decoder 106 may map the first memory cell 124 and a second memory cell 127 to the same row address. In other words, the row decoder 106 collectively selects both the first memory cell 124 and a second memory cell 127. The column decoder 112 may separate the two column addresses of the first memory cell 124 and a second memory cell 127. In other words, the column decoder 112 individually selects the first memory cell 124 and a second memory cell 127. This allows the first memory cell 124 and a second memory cell 127 to be separately programmed (e.g., written) and to be separately sensed (e.g., read). In some embodiments, the first memory cell 124 and the second memory cell 127 may be located on two different decks of a stacked array, sharing the row 201 between decks.

FIG. 2B shows another embodiment of a memory cell pair 121 made up of a first memory cell 124 and a second memory cell 127 that are paired together. From an end user perspective, the memory cell pair 121 appears as a single logical cell, however, it is made up of two separate physical memory cells. In FIG. 2B, the first memory cell 124 and a second memory cell 127 share the same column (e.g., bit line) 210 but are located on different rows (e.g., word lines) 212, 215. The first row 212 couples to the first memory cell 124 while a second row 215 couples to the second memory cell 127. In some embodiments the first row 212 and second row 215 are adjacent. In other embodiments, they are not adjacent.

The column decoder 112 may map the first memory cell 124 and a second memory cell 127 to the same column address. In other words, the column decoder 112 collectively selects both the first memory cell 124 and a second memory cell 127. The column decoder 112 may separate the two row addresses of the first memory cell 124 and a second memory cell 127. In other words, the row decoder 106 individually selects the first memory cell 124 and a second memory cell 127. This allows the first memory cell 124 and a second memory cell 127 to be separately programmed (e.g., written) and to be separately sensed (e.g., read). In some embodiments, the first memory cell 124 and the second memory cell may be located on two different decks of a stacked array, sharing the column 210 between decks.

Figure 3A:
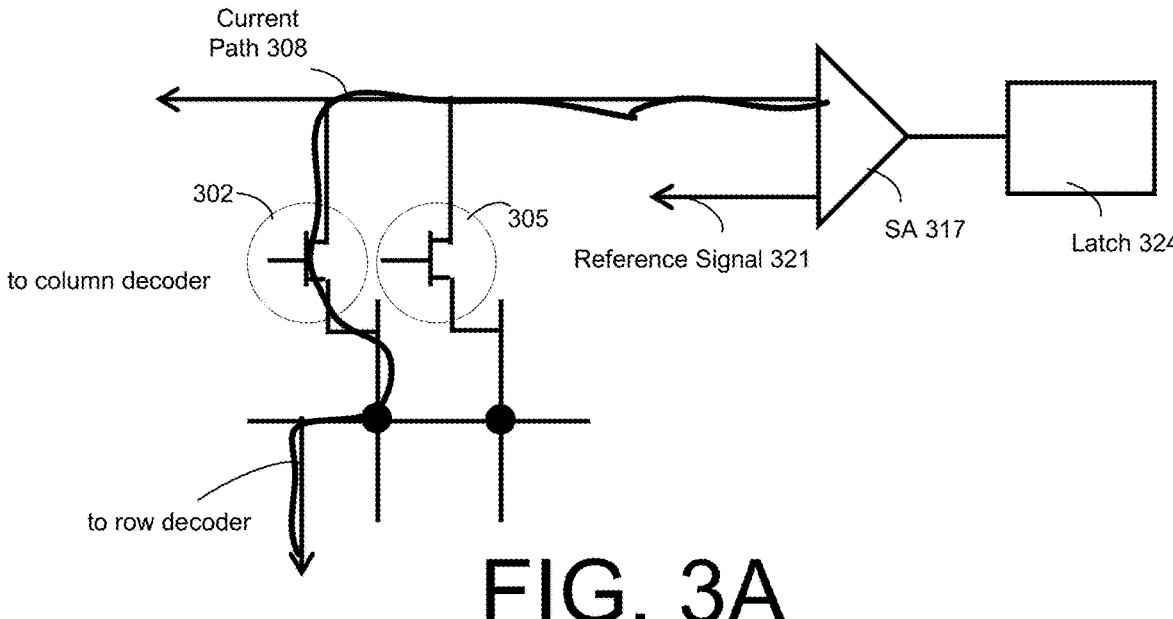
FIG. 3A is a schematic of storing a single bit in a single memory cell.

FIG. 3A is a schematic of storing a single bit in a single memory cell. FIG. 3A depicts an architecture where one logical bit maps to one physical memory cell. The memory architecture of FIG. 3A includes a plurality of memory cells having a first memory cell 302 and a second memory cell 305. The first memory cell 302 and 305 are not paired such that they each represent their own, respective logical bit. FIG. 3A shows independently reading the first memory cell 302 without activating the second memory cell 305, even though the second memory cell may be located on the same column or row as the first memory cell 302. The row decoder activates the first memory cell 302 by applying a specific bias voltage to the row associated with the first memory cell 302. For example, one or more current mirrors may be turned on to apply row demarcation voltage to the row of the first memory cell 302.

In addition, a column decoder activates the first memory cell 302 by applying a specific bias voltage to the column associated with the first memory cell 302. A column demarcation voltage is generated and applied to this column. The column demarcation voltage may be specified so that the first memory cell 302 thresholds if it is encoded with a binary "1" but does not threshold if it is encoded with a binary "0." The memory device may wait a particular period of time for allowing the first memory cell to threshold.

The column demarcation voltage may be reduced to the point where sensing is permitted while also ensuring that the memory cell can still threshold if it were encoded with a binary "1." A sense amp 317 may then sense the current along the current path 308. The sense amp 317 may compare the current/voltage along the current path 308 to a reference signal (e.g., a reference current or voltage). The comparison is compared to a threshold to determine whether the first memory cell 302 stores a binary "1" or binary "0." The result is then latched onto a clock signal using a latch 324.

Figure 3B:
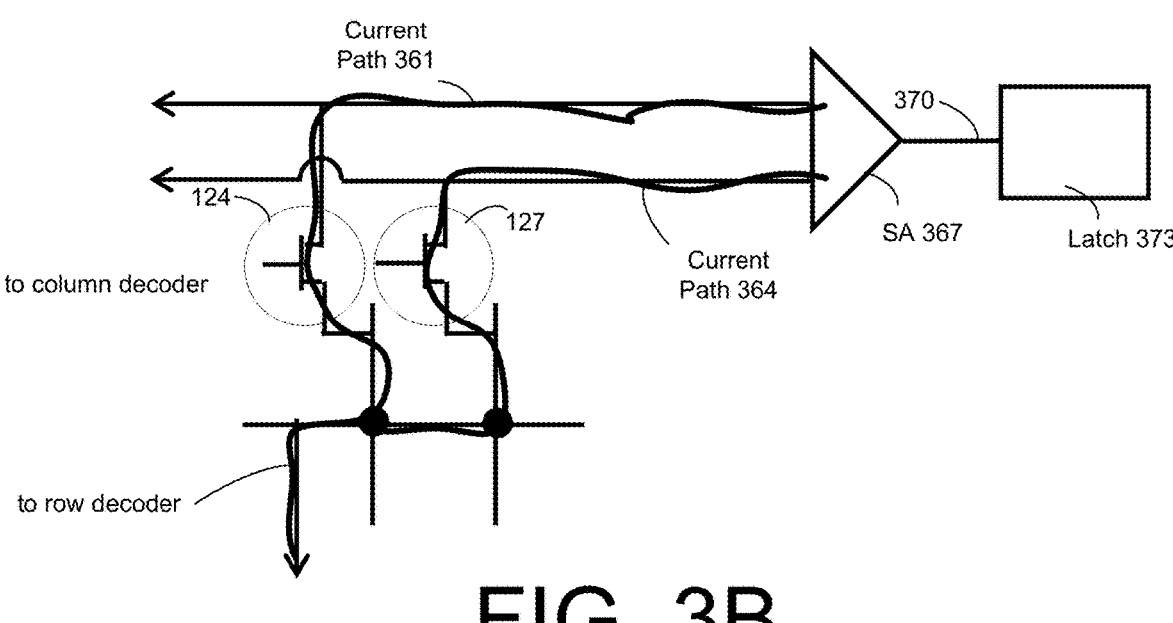
FIG. 3B is a schematic of storing a single bit in a memory cell pair according to various embodiments of the present disclosure.

FIG. 3B is a schematic of storing a single bit in a memory cell pair according to various embodiments of the present disclosure. FIG. 3B shows an embodiment where a memory cell pair contains a first memory cell 124 and a second memory cell 127, where the memory cell pair maps to a single, logical bit. Moreover, FIG. 3B shows the first memory cell 124 and second memory cell 127 sharing the same row while being located on separate columns.

The row decoder activates the first memory cell 124 and second memory cell 127 by applying a specific bias voltage to the common row associated with the first memory cell 124 and second memory cell 127. For example, one or more current mirrors may be turned on to apply row bias voltage to the row of the first memory cell 124.

In addition, a column decoder activates the first memory cell 124 and second memory cell 127 by applying a specific bias voltage to the column associated with the first memory cell 124 and second memory cell 127. A column bias voltage is generated and applied to the columns. A max column bias voltage setting may be used to ensure that any activated memory cells can threshold if encoded with a binary "1." In some embodiments, the column bias voltage may be applied before, during, or after the row bias voltage is applied.

The memory device may wait a particular period of time for allowing one of the two memory cells 124, 127 to threshold. The column bias voltage may be reduced to the point where sensing is permitted while also ensuring that the memory cell encoded with the binary "1" can still threshold. A sense amp 367 may then sense the differential current along a first current path 361 across the first memory cell 124 and a second current path 364 across the second memory cell 127. The sense amp 367 may generate a differential signal 370. Because the memory cell pair stores reciprocal values, the differential signal 370 will either be a positive value or a negative value. The differential signal 370 is converted into a binary value that logically represents the state of the memory cell pair. The sense amp 367 along with any corresponding logic may represent comparator circuitry that compares a current or voltage through the first memory cell 124 and a current or voltage through the second memory cell 127 to determine a value of the single bit in response to the read operation. The result is then latched onto a clock signal using a latch 373.

Figure 4:
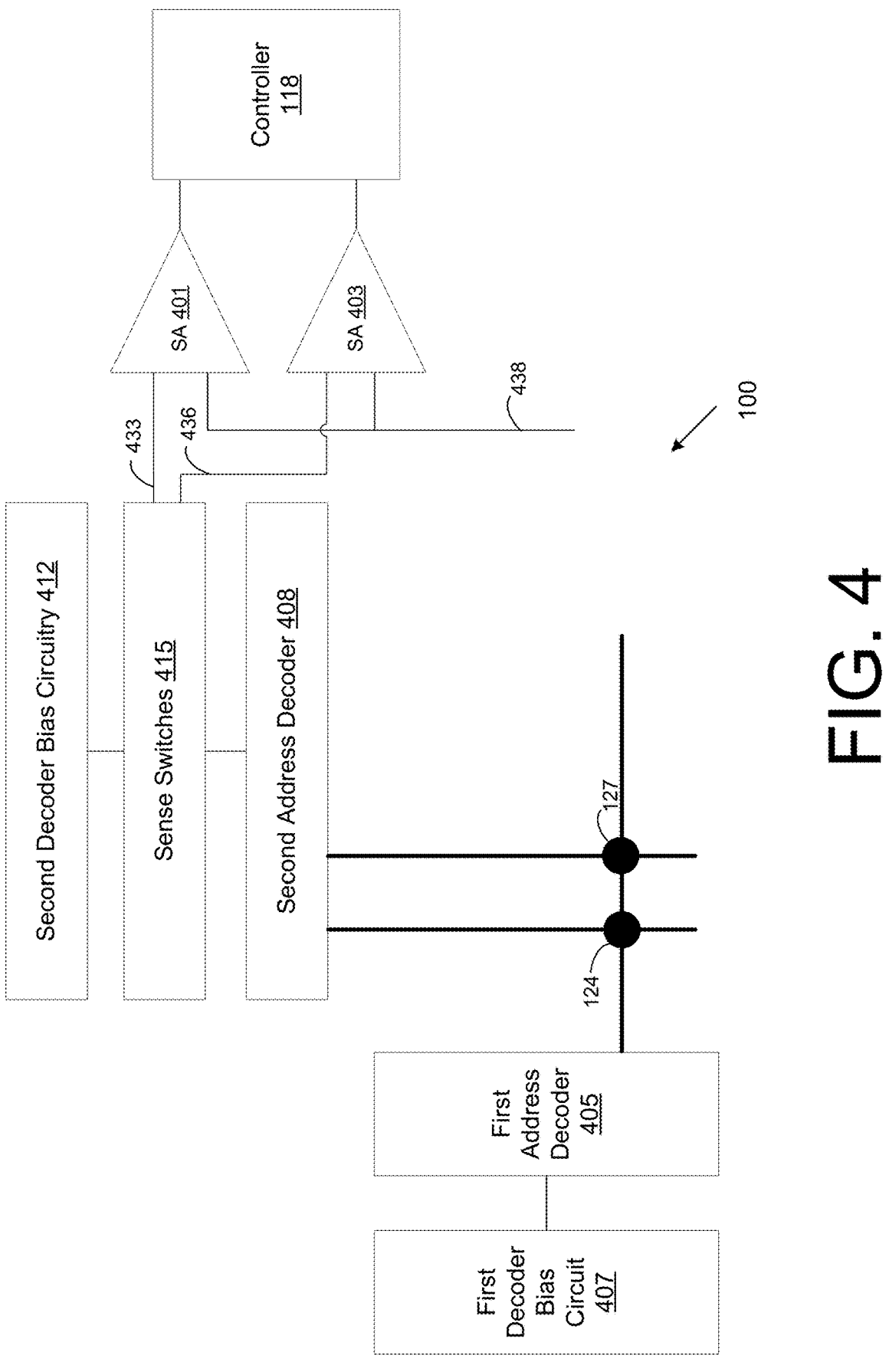
FIG. 4 is a schematic of a portion of a memory device that compares current signals according to embodiments of the present disclosure.

FIG. 4 is a schematic of a portion of a memory device that compares current signals according to embodiments of the present disclosure. For example, rather than using a sense amp that directly receives a first current path 361 across the first memory cell 124 and a second current path 364 across the second memory cell 127, FIG. 4 shows an embodiment of comparator circuitry using at least two sense amps 401, 403. In FIG. 4, a first address decoder 405 collectively selects a memory cell pair made up of a first memory cell 124 and a second memory cell 127. A first decoder bias circuit 407 applies a bias voltage to the line that is shared between the first memory cell 124 and a second memory cell 127.

A second address decoder 408 individually selects first memory cell 124 and the second memory cell 127, which are individually selected on separate lines. A second decoder bias circuitry 412 applies a bias voltage to the separate lines corresponding to the first memory cell 124 and a second memory cell 127. Thereafter, a set of sense switches 415 establishes a circuit and creates a first current path 433, where the first current path includes the first memory cell 124 and a second current path 436 that includes the second memory cell 127. The first current path 433 represents the state of the first memory cell 124 (e.g., binary "1" or "0") while the second current path 436 represents the state of the second memory cell 127, which is the reciprocal of the state of the first memory cell 124.

A first sense amp 401 compares the current of the first current path 433 to a reference signal 438 and generates a first differential output. A second sense amp 403 compares the current of the second current path 436 to the reference signal 438 and generates a second differential output. The controller 118 embodies logic that compares the outputs of the first sense amp 401 and second sense amp 403 to determine the binary value that logically represents the state of the memory cell pair. This binary value may be latched onto a clock signal.

In some embodiments, the first address decoder 405 comprises a row decoder while the second address decoder 408 comprises a column decoder. In other embodiments, the first address decoder 405 comprises a column decoder while the second address decoder 408 comprises a row decoder.

Figure 5:
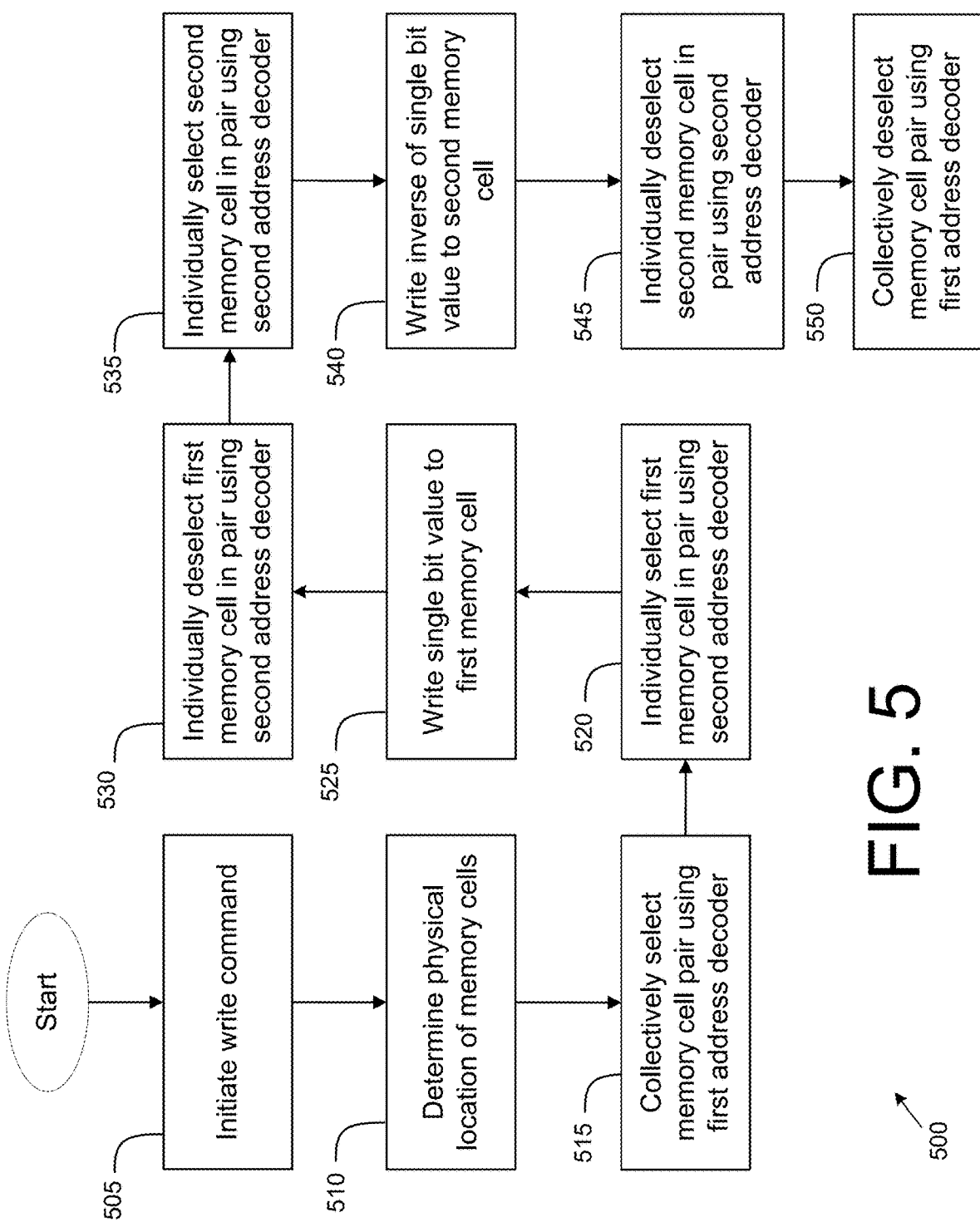
FIG. 5 is a flowchart illustrating an example of the functionality relating to a write operation performed by the memory device according to various embodiments.

FIG. 5 is a flowchart illustrating an example of the functionality relating to a write operation performed by the memory device according to various embodiments. It is understood that the flowchart of FIG. 5 provides an illustrative example of the many different types of functional arrangements that may be employed to implement the memory device 100 as described herein. The flowchart of FIG. 5 may also be viewed as depicting an example of a method 500 implemented in the memory device 100 according to one or more embodiments. Specifically, FIG. 5 shows an example of functionality of a controller 118 configured to perform a write operation.

At item 505, the memory device 100 initiates a write command. The write command may identify an address location and a value to be written to the address location. The write command may be stored in a queue that is fetched by the controller 118. The controller initiates the write command by controlling various components of the memory device 100 to execute the write command.

At item 510, the memory device 100 determines the physical location of the memory cells. The memory cells may be addressed according to the address specified in the write command. The memory device 100 may identify a plurality of memory cell pairs 121 that are to be written to using the value specified in the write command.

At item 515, the memory device 100 collectively selects a memory cell pair 121 using a first address decoder (e.g., a row decoder 106 or column decoder 112). This process may apply to each memory cell pair 121 within the address range specified by the write command. A bias voltage may be generated and applied to a common line shared by the two memory cells within the memory cell pair.

At item 520, the memory device 100 individually selects the first memory cell 124 in the pair using second address decoder (e.g., a row decoder 106 or column decoder 112).

At item 525, the memory device 100 writes a single bit value to first memory cell 124. The single bit value is determined by the value specified in the write command. The memory device may modify the resistance of the first memory cell 124 to encode the single bit value.

At item 530, the memory device 100 individually deselects the first memory cell 124 in pair using the second address decoder. Deselection may be achieved by removing a selection bias voltage (e.g., applying a zero bias voltage or other voltage to deselect the line).

At item 535, the memory device 100 individually selects the second memory cell 127 in the pair using the second address decoder.

At item 540, the memory device writes the inverse of single bit value to the second memory cell 127. Specifically, the second memory cell 127 will have the inverse or reciprocal binary value of the first memory cell 124.

At item 545, the memory device 100 individually deselects the second memory cell 127 in pair using the second address decoder.

At item 550, the memory device 100 collectively deselects the memory cell pair 121 using the first address decoder.

While FIG. 5 shows a particular order of operation relating to selecting and deselecting lines, it should be appreciated that the order may be rearranged while achieving a similar result.

Figure 6:
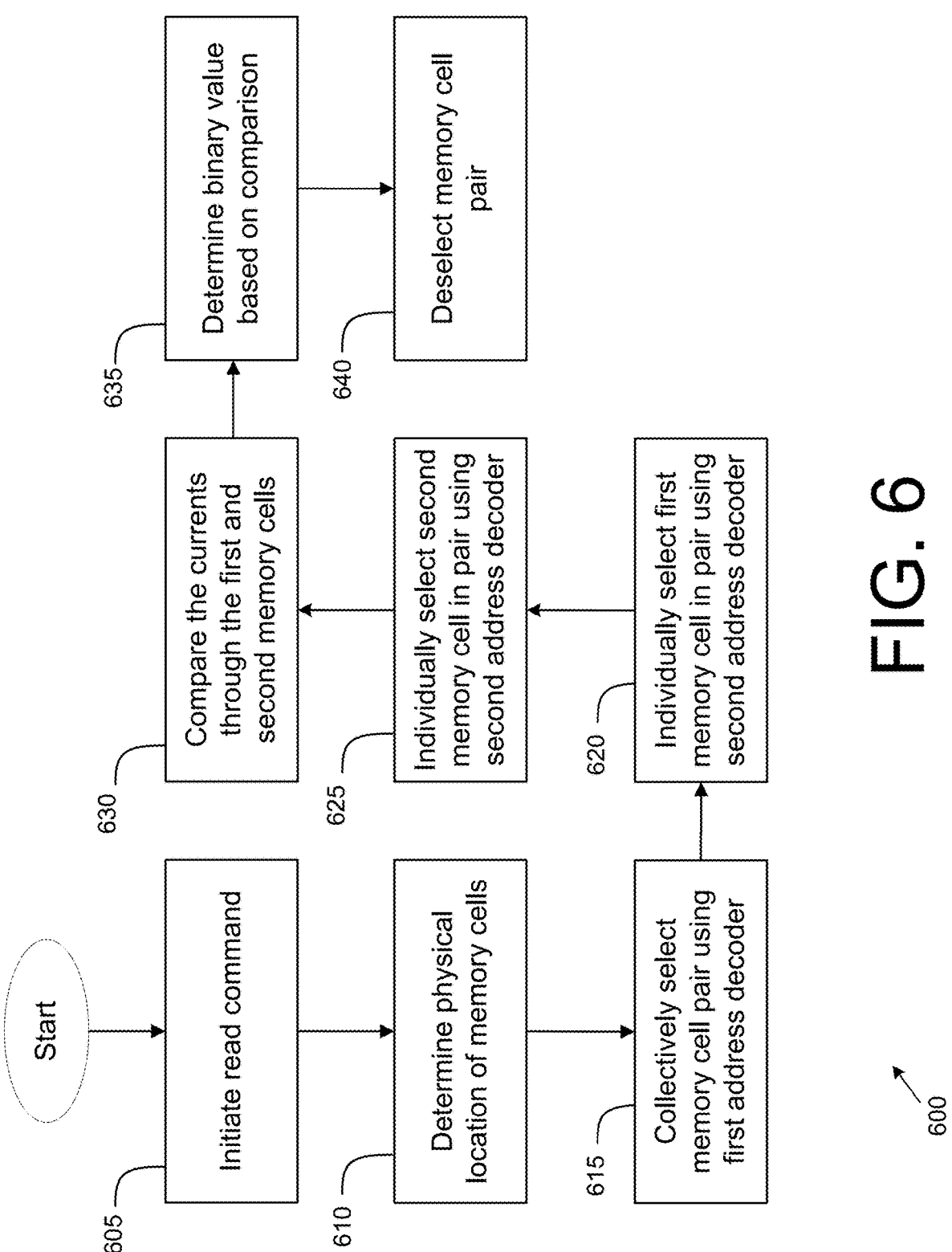
FIG. 6 is a flowchart illustrating an example of the functionality relating to a read operation performed by the memory device according to various embodiments.

FIG. 6 is a flowchart illustrating an example of the functionality relating to a read operation performed by the memory device according to various embodiments. It is understood that the flowchart of FIG. 6 provides an illustrative example of the many different types of functional arrangements that may be employed to implement the memory device 100 as described herein. The flowchart of FIG. 6 may also be viewed as depicting an example of a method 600 implemented in the memory device 100 according to one or more embodiments. Specifically, FIG. 6 shows an example of functionality of a controller 118 configured to perform a read operation.

At item 605, the memory device initiates a read command. The read command may identify an address range within the memory device. The output after completing a read command is the bit values associated with the address range. The read command may be stored in a queue that is fetched by the controller 118. The controller initiates the read command by controlling various components of the memory device 100 to execute the read command.

At item 610, the memory device 100 determines the physical location of the memory cells. The memory cells may be addressed according to the address specified in the read command. The memory device 100 may identify a plurality of memory cell pairs 121 that are to be read to using the address range specified in the read command.

At item 615, the memory device 100 collectively selects a memory cell pair 121 using a first address decoder (e.g., a row decoder 106 or column decoder 112). This process may apply to each memory cell pair 121 within the address range specified by the read command. A bias voltage may be generated and applied to a common line shared by the two memory cells within the memory cell pair.

At item 620, the memory device 100 individually selects the first memory cell 124 in the pair using second address decoder (e.g., a row decoder 106 or column decoder 112).

At item 625, the memory device 100 individually selects the second memory cell 127 in the pair using the second address decoder. Memory cells on unshared lines may be selected simultaneously.

At item 630, the memory device 100 compares the current through the first memory cell 124 and the current through the second memory cell 127. In some embodiments, a sense amplifier 367 is configured to determine a differential current between the current through the first memory cell 124 and the current through the second memory cell 127. In other embodiments, the two sense amplifiers 401, 403 compare the current through the first memory cell 124 and the current through the second memory cell 127 by first comparing each current to a reference signal.

At item 635, the memory device 100 determines a binary value based on the comparison. The binary value represents the logical single bit stored by the memory cell pair. The memory device 100 may use comparator circuitry including sense amplifiers and logical to compare the current between the two cells in the memory cell pair and apply the different signal to a threshold.

At item 640, the memory device 100 deselects the memory cell pair. For example, the first address decoder and the second address decoder deselect the first cell 124 and second cell 127 in the memory cell pair 121.

While FIG. 6 shows a particular order of operation relating to selecting and deselecting lines, it should be appreciated that the order may be rearranged while achieving a similar result.

The foregoing components and/or their functionality may be implemented a various systems and methods. Some embodiments include an electronic device such as, for example, an integrated circuit, chip, die, or other semiconductor device. The electronic device may be a memory device comprising memory arrays and peripheral circuitry, microprocessors, general purpose processors, or special purpose processors, discrete logic circuits having logic gates for implementing various logic functions, application specific integrated circuits (ASICs) having appropriate logic gates, field-programmable gate arrays (FPGAs), or other semiconductor devices, etc.

Various components described herein (e.g., decoders, controllers, sense amplifiers, transistors, switches, active components, signal generators, etc.) may be implemented using transistors or other similar switching components. A switching component or a transistor discussed herein may represent a field effect transistor (FET) and comprise a three-terminal device including a source, drain, and gate. The terminals may be connected to other electronic elements through conductive materials, e.g., metals. The source and drain may be conductive and may comprise a heavily doped, e.g., degenerate, semiconductor region. The source and drain may be separated by a lightly-doped semiconductor region or channel. If the channel is n-type (e.g., majority carriers are electrons), then the FET may be referred to as an n-type FET. If the channel is ptype (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

Some embodiments may include methods for manufacturing the electronic device. This may involve techniques related to semiconductor fabrication or other techniques of coupling electronic circuits together to form conductive paths for electronic communication. Methods further include operating a device after it has been manufactured or otherwise produced and ready for operation in the field. For example, operating an electronic device includes generating signals (e.g., voltages, currents), activating, switching, sensing, selecting, or reading signals.

Terms such as "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components.

At any given time, the conductive path between components that are in electronic communication with each other (or in conductive contact with or connected with or coupled with) may be an open circuit or a closed circuit based on the operation of the device that may include the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" includes the condition of moving from an open-circuit relationship between components in which signals are not presently capable of being communicated between the components over a conductive path to a closed-circuit relationship between components in which signals can be communicated between components over the conductive path. When a component, such as a transistor, switching component in conduction with conductive paths couple other components together, the component initiates a change that allows signals to flow between the other components over the conductive path that previously did not permit signals to flow.

It should be noted that the methods described above describe possible implementations, and that the operations and the steps may be rearranged or otherwise modified and that other implementations are possible. Furthermore, features from two or more of the methods may be combined. Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths. and/or operating the electronic device after it has been manufactured.

In addition, the foregoing components may be embodied as program code using a hardware description language such as, for example, Verilog, VHDL, or other similar languages. The program code may be stored in computer-readable medium. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

The flowcharts discussed above show the functionality and operation of an implementation of components within a system or electronic device. Each block may represent a circuit or a number of interconnected circuits to implement the specified logical function(s).

Although the flowcharts show a specific order of execution, it is understood that the order of execution may differ from that which is depicted. For example, the order of execution of two or more boxes may be scrambled relative to the order shown. Also, two or more boxes shown in succession may be executed concurrently or with partial concurrence. Further, in some embodiments, one or more of the boxes may be skipped or omitted. It is understood that all such variations are within the scope of the present disclosure.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. A device, comprising:
a plurality of memory cells arranged in a plurality of memory cell pairs each connected to a word line and a bit line; and
a controller configured to perform a write operation comprising:
select a first memory cell of a memory cell pair of the plurality of memory cell pairs;
write a single bit value to the first memory cell;
select a second memory cell of the memory cell pair, wherein the first memory cell and the second memory cell are not adjacent on each of their respective word lines and bit lines; and
write an inverse of the single bit value to the second memory cell,
wherein the first memory cell is individually selected at a first time using an address decoder.

2. The device of claim 1, wherein the controller is further configured to deselect, using the address decoder, the first memory cell after the single bit value is written to the first memory cell.

3. The device of claim 2, wherein deselection of the first memory cell further occurs prior to selection of the second memory cell using the address decoder.

4. The device of claim 1, wherein the second memory cell is individually selected at a second time using the address decoder, wherein the first time is different from the second time.

5. The device of claim 1, wherein the plurality of memory cells comprises a plurality of different decks of memory cells.

6. The device of claim 5, wherein the first memory cell is located on a first deck of the different decks of memory cells and the second memory cell is located on a second deck of the different decks of memory cells.

7. The device of claim 6, wherein the first deck is stacked on top of the second deck.

8. The device of claim 6, wherein the second deck is stacked on top of the first deck.

9. The device of claim 6, wherein a third deck of the different decks of memory cells is located between the first deck and the second deck.

10. The device of claim 6, wherein the first memory cell and the second memory cell are located on a same row shared between the first deck and the second deck.

11. A device, comprising:
a plurality of memory cells each connected to a word line and a bit line, each of the plurality of memory cells further arranged in different layers that are stacked on one another; and
a controller configured to perform a write operation comprising:
select a first memory cell of a memory cell pair;
write a single bit value to the first memory cell;
select a second memory cell of the memory cell pair, wherein the first memory cell is on a first layer of the different layers and the second memory cell is on a second layer of the different layers, and wherein the first memory cell and the second memory cell are not adjacent on each of their respective word lines and bit lines; and
write an inverse of the single bit value to the second memory cell,
wherein the first memory cell is individually selected at a first time using an address decoder.

12. The device of claim 11, wherein the first layer is stacked on top of the second layer.

13. The device of claim 11, wherein the second layer is stacked on top of the first layer.

14. The device of claim 11, wherein a third layer of the different layers is located between the first layer and the second layer.

15. The device of claim 11, wherein the first memory cell and the second memory cell are located on a same row shared between the first layer and the second layer.

16. A device, comprising:
a plurality of memory cells each connected to a word line and a bit line, each of the plurality of memory cells further arranged in a plurality of different decks of memory cells; and
a controller configured to perform a read operation comprising:
select a first memory cell of a memory cell pair and a second memory cell of the memory cell pair; and
determine a binary value stored in the memory cell pair based on a comparison of respective currents through each of the first memory cell and the second memory cell of the memory cell pair,
wherein the first memory cell is located on a first deck of the different decks and the second memory cell is located on a second deck of the different decks, and
wherein the first memory cell and the second memory cell are not adjacent on each of their respective word lines and bit lines,
wherein the first memory cell is individually selected at a first time using an address decoder.

17. The device of claim 16, wherein the first deck is stacked on top of the second deck or the second deck is stacked on top of the first deck.

18. The device of claim 16, wherein a third deck of the different decks of memory cells is located between the first deck and the second deck.

19. The device of claim 16, wherein the first memory cell and the second memory cell are located on a same row shared between the first deck and the second deck.

* * * * *